(12) United States Patent
Huang

(10) Patent No.: US 8,776,783 B2
(45) Date of Patent: Jul. 15, 2014

(54) SOLAR ENERGY COLLECTOR AND SOLAR ENERGY MODULE HAVING SAME

(75) Inventor: Shan-Fu Huang, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 1183 days.

(21) Appl. No.: 12/649,497

(22) Filed: Dec. 30, 2009

(65) Prior Publication Data
US 2010/0313879 A1 Dec. 16, 2010

(30) Foreign Application Priority Data
Jun. 16, 2009 (CN) .......................... 2009 1 0303281

(51) Int. Cl.
*F24J 2/08* (2006.01)

(52) U.S. Cl.
USPC ........... 126/683; 126/684; 126/698; 126/907; 359/742

(58) Field of Classification Search
USPC ................. 126/683, 684, 698, 907; 359/742
See application file for complete search history.

(56) References Cited

U.S. PATENT DOCUMENTS

| | | | |
|---|---|---|---|
| 4,653,472 A * | 3/1987 | Mori | 126/683 |
| 4,682,582 A * | 7/1987 | Zsida | 126/683 |
| 4,723,535 A | 2/1988 | Lew | |
| 7,160,522 B2 * | 1/2007 | Minano Dominguez et al. | 422/186.3 |
| 2005/0024746 A1 * | 2/2005 | Shimura | 359/742 |
| 2009/0000612 A1 * | 1/2009 | Hines et al. | 126/683 |

FOREIGN PATENT DOCUMENTS

| | | |
|---|---|---|
| CN | 201118470 Y | 9/2008 |
| CN | 101375112 | 2/2009 |
| CN | 101425547 | 5/2009 |
| TW | 200921920 A | 5/2009 |
| TW | M356016 U | 5/2009 |

* cited by examiner

*Primary Examiner* — Avinash Savani
(74) *Attorney, Agent, or Firm* — Novak Druce Connolly Bove + Quigg LLP

(57) ABSTRACT

A solar energy collector includes a frustoconical reflective shell and a light converging lens. The frustoconical reflective shell includes a top opening and an opposite bottom opening. The reflective shell tapers from the top opening to the bottom opening. The reflective shell is configured for reflecting light. The light converging lens is arranged at the top opening and is fixed on the sidewall of the reflective shell. The light concentration lens includes a central lens portion and a periphery lens portion. The central lens portion includes a first light incident portion facing away from the bottom opening. The central lens portion includes a plurality of concentric annular prisms cooperatively forming a Fresnel-lens structure. The periphery lens portion is arranged surrounding the central lens portion. The periphery lens portion includes a convex second lens portion.

8 Claims, 2 Drawing Sheets

SOLAR ENERGY COLLECTOR AND SOLAR ENERGY MODULE HAVING SAME

BACKGROUND

1. Technical Field

The disclosure relates to a solar energy collector and a solar energy module having a solar energy collector.

2. Description of Related Art

Solar energy conversion modules that convert sunlight into electrical energy typically employ photovoltaic or photoelectric cells that directly convert the solar energy into electrical energy. The amount of energy created by the cell is directly related to the amount of solar energy the cell absorbs. The amount of energy absorbed by the cell depends on the size and surface area of the cell and the cell and the intensity or brightness of the sunlight incident on the cell.

Typically, a photo-sensor panel of the cell is directly exposed to ambient. In order to obtain enough solar energy, a surface area of the photo-sensor panel is generally made large. This may increase the cost of the cell.

What is needed, therefore, is a solar energy collector providing efficient collection of solar energy and a solar energy module applying the same.

BRIEF DESCRIPTION OF THE DRAWING

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

Figure 1:
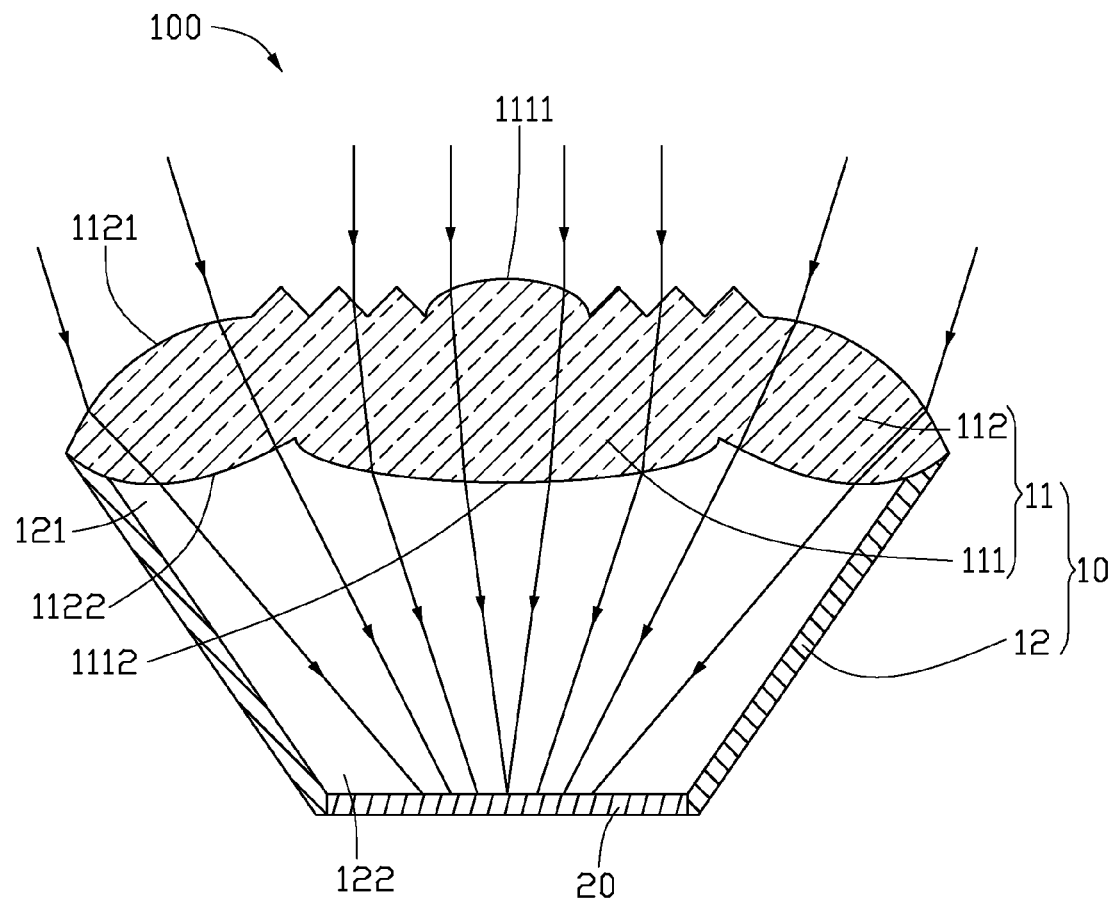
FIG. 1 is a sectional view of a solar energy module according to an exemplary embodiment.
Figure 2:
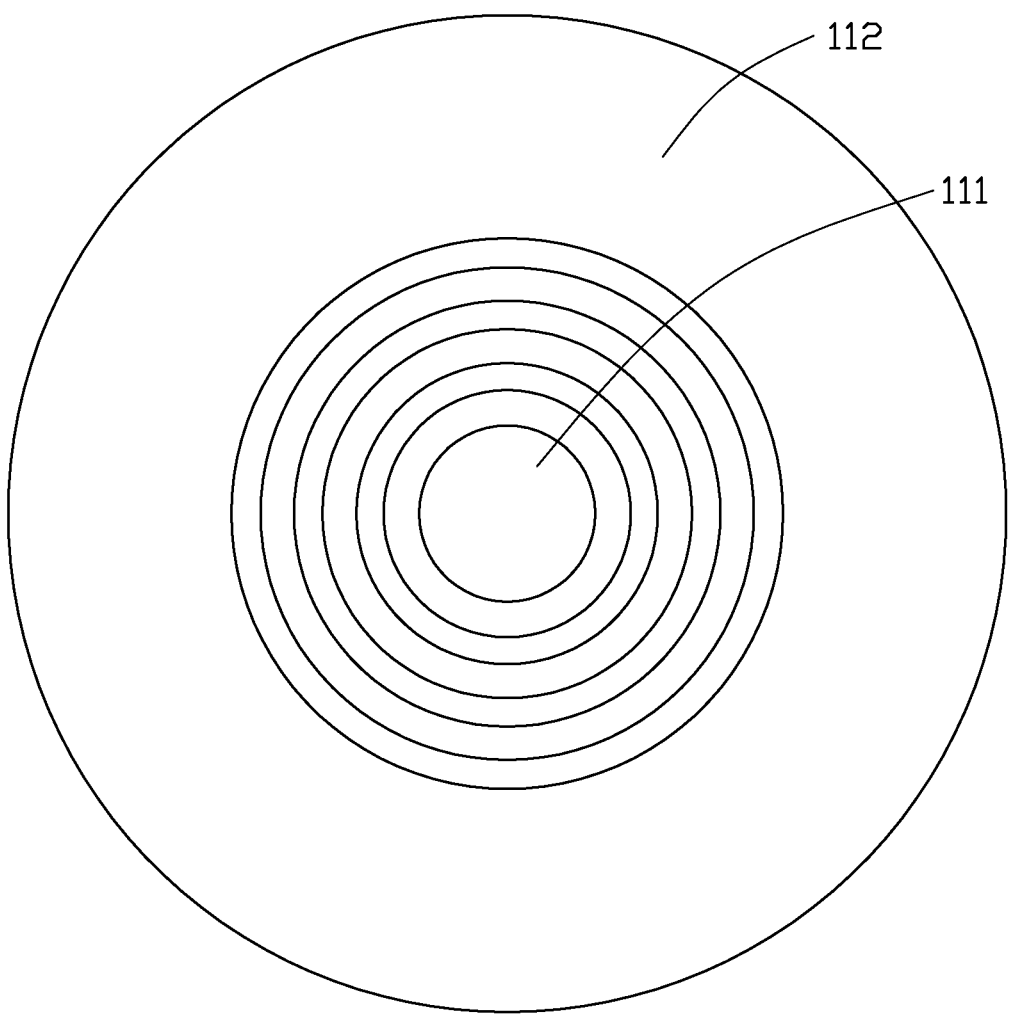
FIG. 2 is a top view of the solar energy module of FIG. 1.

Referring to FIGS. 1 and 2, a solar energy module 100 in accordance with an exemplary embodiment includes a solar energy collector 10 and a photoelectric conversion unit 20. The solar energy collector 10 includes a light concentration lens 11 and a reflective shell 12. The solar energy collector is configured for collecting solar energy for the photoelectric conversion unit 20. In this embodiment, the photoelectric conversion unit 20 is a solar cell panel.

The reflective shell 12 is frustoconical. The reflective shell 12 has a top opening 121 and a bottom opening 122, and tapers from the top opening 121 to the bottom opening 122. The light concentration lens 11 is arranged at the top opening 121, and the photoelectric conversion unit 20 is arranged at the bottom opening 122. The reflective shell 12 has an inner reflective surface. In this exemplary embodiment, a reflective film can be attached on the inner surface of the reflective shell 12 to enhance reflection. The reflective film can be an optical multilayer film or a metal total-reflection film.

The light concentration lens 11 includes a central lens portion 111 and periphery lens portion 112 fixed at a periphery of the central lens portion 111. The central lens portion 111 is at the center of the light concentration lens 11, and includes a first light incident portion 1111 and a first light output portion 1112. The first light incident portion 1111 includes a convex micro-lens at the center thereof, and a plurality of concentric, annular prisms surrounding the micro-lens to form a Fresnel-lens. The first light incident portion 1111 is configured for converging ambient light. The first light output portion 1112 is convex-arc-shaped, and is at an opposite side of the first light incident portion 1111. The second portion 1112 can further concentrate the light which is concentrated by the first light incident portion 1111.

The periphery lens portion 112 has an annular shape and surrounds the central lens portion 111. The periphery lens portion 112 includes a second light incident portion 1121 and a second light output portion 1122 at an opposite side of the second light incident portion 1121. The second light incident portion 1121 is adjacent to the first light incident portion 1111, and the second light output portion 1122 is adjacent to the first light output portion 1112. The second light incident portion 1121 and second light output portion 1122 are both convex, such that the periphery lens portion 112 can concentrate ambient light incident thereon on the photoelectric conversion unit 20. In this exemplary embodiment, the central lens portion 111 and the periphery lens portion 112 are unitarily formed of a material. That is, the light concentration lens 11 is a single body of material comprising the central lens portion 111 and the periphery lens portion 112.

The light concentration lens 11 is arranged at the top opening 121 of the reflective shell 12. The first and second light incident portions 1111 and 1121 are facing away from the bottom opening 122. The periphery lens portion 112 is inclined downwardly from central lens portion 111 toward the photoelectric conversion unit 20, such that more surface area of light concentration lens 11 is used for collecting ambient light. An imaginary longest chord of the light concentration lens 11 has a length substantially the same as the diameter of the top opening 121. That is, a circumference of the light concentration lens 11 is substantially the same as that of the top opening 121. The sidewall of the reflective shell 12 at the top opening 121 and the light concentration lens 11 abut each other, with the interstitial space therebetween being sealed. The sealing may be alternately achieved by, e.g., interference fit or applying a transparent adhesive.

The photoelectric conversion unit 20 is arranged at the bottom opening 122 of the reflective shell 12, and is facing toward the first and second light output portions 1112 and 1122 of the light concentration lens 11. The sidewall of the reflective shell 12 at the bottom opening 122 and the photoelectric conversion unit 20 abut each other, with the interface therebetween being sealed. The sealing may be achieved by, e.g., interference fit or applied transparent adhesive.

In an alternative embodiment, the reflective shell 12 of the solar energy collector 10 is made of a light-pervious material. In this case, the outer surface of the reflective shell 12 can also be reflective. In an alternative embodiment, a reflective film can be attached on the outer surface of the reflective shell 12. The reflective film can be an optical multilayer film or a metal total-reflection film.

The central lens portion 111 and the periphery lens portion 112 of the solar energy collector 10 can concentrate sun's rays onto the photoelectric conversion unit 20. Because the light concentration lens 11 is arranged at the top opening 121 with a larger area than the bottom opening, which the photoelectric conversion unit 20 is arranged, more sun's rays are concentrated on the photoelectric conversion unit 20 than directly exposed to ambient. The photoelectric conversion unit 20 can be made with a smaller surface area, thereby reducing the cost thereof.

It is to be understood that the described embodiments are intended to illustrate rather than limit the embodiments. Variations may be made without departing from the spirit of the embodiments as claimed. The above-described embodiments illustrate the scope of the disclosure but do not restrict the scope of the disclosure.

What is claimed is:

1. A solar energy collector of comprising:
   a frustoconical reflective shell comprising a top opening and an opposite bottom opening, the reflective shell tapering from the top opening to the bottom opening, the reflective shell configured for reflecting light; and
   a light converging lens arranged at the top opening and fixed on the side wall of the reflective shell, the light converging lens comprising:
   a central lens portion, the central lens portion comprising a first light incident portion and an opposite first light output portion, the first light incident portion comprising a plurality of concentric annular prisms cooperatively forming a Fresnel-lens structure, the first light incident portion facing away from the bottom opening, and
   a periphery lens portion surrounding the central lens portion, the periphery lens portion comprising a second light incident portion and an opposite second light output portion, the second light incident portion adjacent to the first light incident portion and facing away from the bottom opening, the second light incident portion being convex, the periphery lens portion being inclined downwardly from the central lens portion toward the bottom opening; wherein the first light incident portion comprises a convex micro-lens at the center thereof, the plurality of concentric annular prisms surrounds the micro-lens to form the Fresnel-lens structure, the first light output portion is convex-arc-shaped.

2. The solar energy collector of claim 1, wherein the sidewall of the reflective shell at the bottom opening and the photoelectric conversion unit abut each other, with the interface therebetween being sealed.

3. The solar energy collector of claim 2, wherein the central lens portion and the periphery lens portion are unitarily formed of a same material.

4. The solar energy collector of claim 2, wherein the periphery lens portion is a biconvex lens.

5. The solar energy collector of claim 2, wherein the reflective shell has an inner reflective surface.

6. The solar energy collector of claim 2, wherein the reflective shell includes a light-pervious body, and a reflective film formed on the outer surface of the light-pervious body.

7. The solar energy collector of claim 6, wherein the reflective film is an optical multi-layer film.

8. The solar energy collector of claim 6, wherein the reflective film is a total-reflection film.

* * * * *